United States Patent [19]
Furuhata et al.

[11] Patent Number: 5,489,812
[45] Date of Patent: Feb. 6, 1996

[54] MICRO ACTUATOR

[75] Inventors: Tomotake Furuhata, Kawasaki; Toshiki Hirano, Tokyo, both of Japan

[73] Assignee: International Business Machines Corporation, Armonk, N.Y.

[21] Appl. No.: 233,486

[22] Filed: Apr. 26, 1994

Related U.S. Application Data

[62] Division of Ser. No. 890,455, May 29, 1992, Pat. No. 5,351,412.

[51] Int. Cl.⁶ .............................. H02N 2/00; B23Q 16/00
[52] U.S. Cl. ........................... 310/309; 310/323; 310/328
[58] Field of Search ..................... 310/324, 328, 310/330–332, 309, 311

[56] References Cited

U.S. PATENT DOCUMENTS

| | | | |
|---|---|---|---|
| 3,146,367 | 8/1964 | McNaney | 310/328 |
| 3,621,328 | 11/1971 | Epstein et al. | 310/328 |
| 3,928,778 | 12/1975 | Ivanov et al. | 310/328 |
| 4,789,803 | 12/1988 | Jacobsen et al. | 310/309 |
| 4,931,752 | 6/1990 | Bray et al. | 333/151 |
| 5,129,132 | 7/1992 | Zdeblick et al. | 29/25.35 |
| 5,235,225 | 8/1993 | Colgate et al. | 310/309 |
| 5,338,997 | 8/1994 | Benecke | 310/331 |
| 5,351,412 | 10/1994 | Furuhata et al. | 33/568 |
| 5,366,587 | 11/1994 | Ueda et al. | 310/309 |

FOREIGN PATENT DOCUMENTS

| | | | |
|---|---|---|---|
| 2114872 | 4/1990 | Japan | 310/309 |
| 0114872 | 4/1990 | Japan | 310/309 |
| 0155374 | 7/1991 | Japan | 310/311 |
| 13235676 | 10/1991 | Japan | 310/311 |
| 4186784 | 7/1992 | Japan | 310/311 |
| 14251579 | 9/1992 | Japan | 310/309 |
| 9003665 | 4/1990 | WIPO | 310/311 |

OTHER PUBLICATIONS

Array–Driven Ultrasonic Microactuators, by Fujita et al. 1991 IEEE.

H. Seidel, et al., "Capacitive Silicon Accelerometer with Highly Symmetrical Design", Transducert '89 Lecture No. B10.4, Jun. 1989.

K. Ikeda, et al., "Silicon Pressure Sensor Integrates Resonant Strain Gauge on Diaphragm", Transducers '89 Lecture No. B4.3, Jun. 1989.

*Primary Examiner*—Thomas M. Dougherty
*Attorney, Agent, or Firm*—H. Daniel Schnurmann

[57] ABSTRACT

A device for providing micro positioning having an operating range in the submicron order in the X and Y directions, respectively. Positioning is achieved by a device which includes a driving section bonded to a silicon wafer for applying a driving force to excite vertical motion, and a mechanism for converting this vertical motion into rotational motion. Three types of micro actuators are described herein: one, that uses vibration as its driving force; a second, that uses Coulomb's force; and a third, that utilizes fluid pressure, such as air.

18 Claims, 5 Drawing Sheets

MICRO ACTUATOR

This application is a divisional application of U.S. Ser. No. 07/890,455, filed on May 29, 1992, issued on Oct. 4, 1994 as U.S. Pat. No. 5,351,412.

FIELD OF THE INVENTION

The present invention relates to a micro positioning device capable of finely positioning a member such as a roller in the X and Y directions.

BACKGROUND OF THE INVENTION

The attempt to compact existing mechanical systems has a rather long history. However, a technology has recently drawn attention to integrate a mechanical system of a size that varies from several micrometers to several hundreds of micrometers. It comprises a plurality of components such as sensors, actuators, and electronic circuits, and preferably use the IC (Integrated Circuit) fabrication technique called MEMS (Micro Electro Mechanical Systems). Sensors in the field of MEMS are fast reaching the level of practical use, mainly as acceleration sensors using transducers, as described in the paper by H. Seidel, et al, "Capacitive Silicon Accelerometer with Highly Symmetrical Design", Transducers '89 Lecture No. B10.4, June 1989, and as pressure sensors, described in the paper by K. Ikeda, et al, "Silicon Pressure Sensor Integrates Resonant Strain Gauge 0n Diaphragm", Transducers '89 Lecture No. B4.3, June 1989. However, the study of micro actuators has just begun. As an example of a micro actuator, an ultrasonic motor using a piezoelectric element is actively studied at present.

OBJECTS AND SUMMARY OF THE INVENTION

The positioning accuracy of detectors in an optical recording or magnetic recording system may be in the future of the order of submicrons. It requires that the positioning device used for the system have an operating range of several hundreds of micrometers in the X and Y directions, respectively, that its size does not exceed several millimeters and, finally, that it get a quick response. Positioning meeting the above requirement can be achieved with a conventional micro ultrasonic motor.

Accordingly, it is an object of the present invention to provide a device capable of achieving fine positioning.

It is another object of the present invention to achieve micro positioning of the order of 100-μm in the X and Y directions.

It is a further object of the present invention to arrange, on the same surface, micro actuators of the order of micrometers using semiconductor fabrication techniques and capable of surface-driving the group of actuators with a driving source.

The micro positioning device of the present invention, as described hereinafter comprises: a substrate, a plurality of micro actuators arranged on the substrate, and a moving member placed on the micro actuators. Each micro actuator consists of a driving section for applying a driving force to excite vertical motion on the substrate, and a mechanism for converting vertical motion into rotational motion, displaced in the horizontal direction. The structure of the micro actuator which is the basic component of the present invention differs in terms of the type of driving force used, as will be shown hereinafter.

The foregoing and other objectives, features and advantages of the present invention will become clearer from the detailed descriptions of the preferred embodiments of the invention, as illustrated in the accompanying figures.

DETAILED DESCRIPTION OF THE INVENTION

Figure 1:
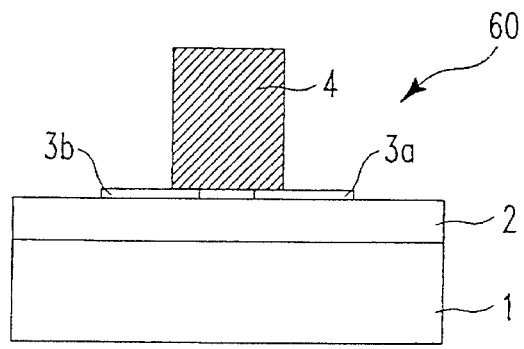
FIG. 1 shows an embodiment of the micro actuator 60 structure according to the present invention.

FIG. 1 shows the structure of a micro actuator using vibration force as its driving force. A piezoelectric element (PZT) 2 is bonded or laminated to substrate 1, (e.g. a silicon wafer). Aluminum electrodes 3A and 3B are deposited on the PZT 2, and a contact pin 4 is formed across the aluminum electrodes. Although polyimide is used for contact pin 4 in this particular embodiment, it may be possible to use resist which allows the pin to have a large aspect ratio.

Figure 2:
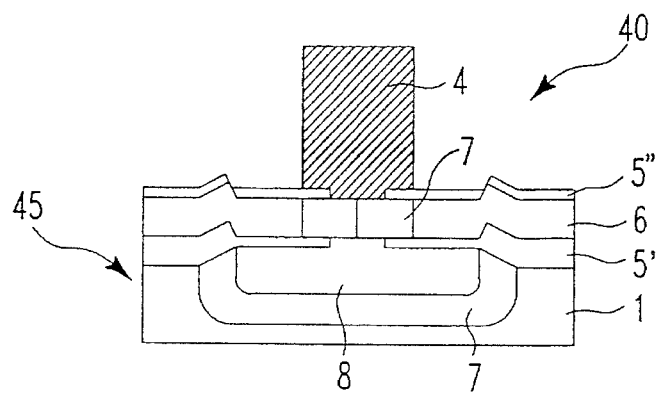
FIG. 2 shows a second embodiment of the micro actuator structure in accordance with the present invention.

FIG. 2 shows the structure of a micro actuator 40 using Coulomb's force as the driving force. Operation of the micro actuator using Coulomb's force will be further described hereinafter. FIGS. 4(a)–4(e) show the fabrication process steps for the driving section 45 of the micro actuator 40. Note that the driving section 45 as shown upon completion in FIG. 4(e) excludes contact pin 4, as illustrated in FIG. 2.

Figure 4A:
FIGS. 4a to 4e show the fabrication process of the micro actuator in FIG. 2.
Figure 4B:
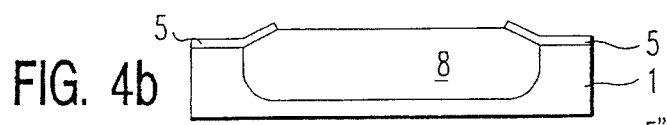
Figure 4C:
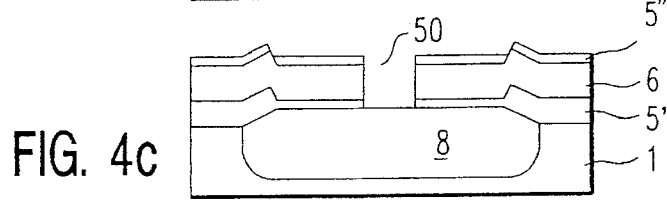
Figure 4D:
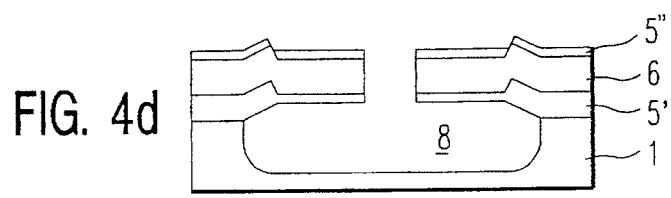
Figure 4E:
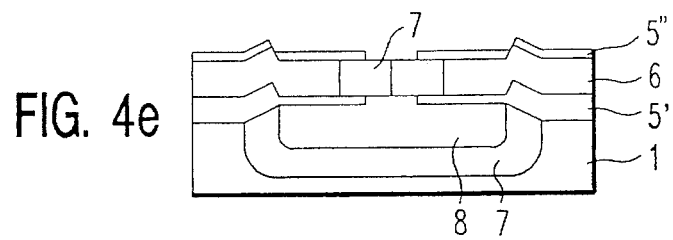

A silicon nitride film is first deposited on a silicon wafer 1. As shown in FIG. 4(a), the silicon nitride film is etched to form a desired pattern 5. Then, steam is applied to silicon wafer 1 to oxidize the etched section 8 to produce the structure shown in FIG. 4(b). Next, additional silicon nitride is deposited on the silicon wafer 1 to form a first silicon nitride film 5', a polycrystal silicon film 6 is deposited on the first silicon nitride film 5', and a second silicon nitride film 5" is deposited on the polycrystal silicon film 6. Following deposition of these layers 5', 6 and 5", the central portion 50 of the layers 5', 6, 5" is etched to a predetermined size to form the structure of FIG. 4(c). Next, the portion 8 is etched at the central section 50 so as to form an opening through the central section 50 to the portion 8, as shown in FIG. 4(d). Subsequently, the silicon wafer 1 is oxidized and oxide films 7 are formed, as shown in FIG. 4(e). The micro actuator 40 with the structure shown in FIG. 2 is obtained by forming the contact pin 4 on the driving section 45 thus fabricated.

Figure 3:
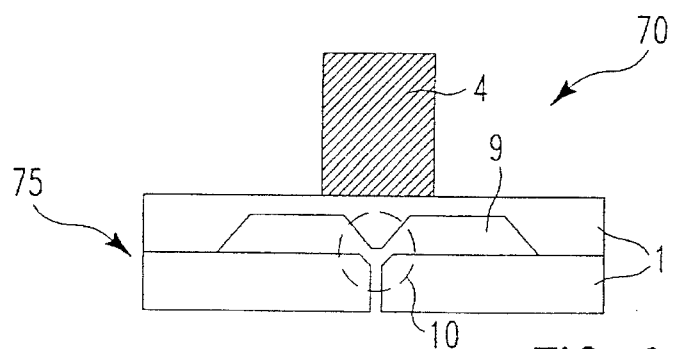
FIG. 3 shows still another embodiment of the micro actuator structure of the present invention.

FIG. 3 shows the structure of a micro actuator 70 using fluid pressure (e.g., air pressure) as its driving force. In this case, the driving section 75 of the micro actuator 70, which excludes the contact pin 4 illustrated in FIG. 3, is fabricated using the process steps shown in FIGS. 5(a)–5(d).

Figure 5A:
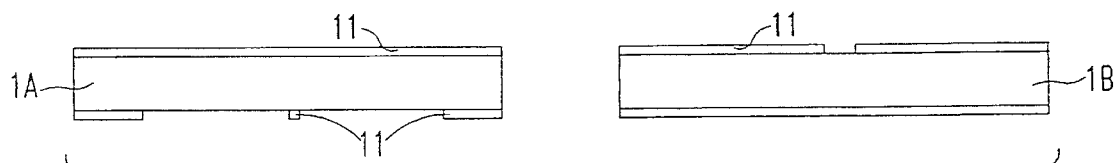
FIGS. 5a to 5d show the fabrication process of the micro actuator in FIG. 3.
Figure 5B:
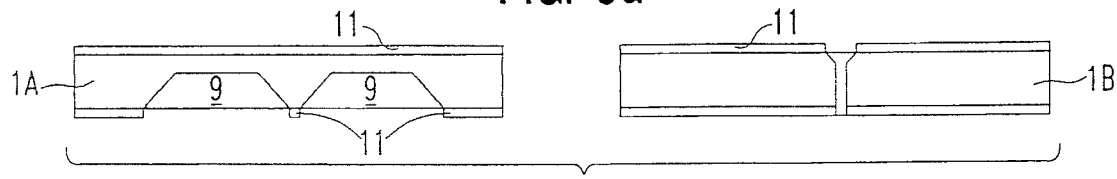

Silicon nitride films 11 are deposited on both sides of a first silicon wafer 1A. A desired pattern is then formed by lithographic techniques and followed by selective etching. Similarly, a silicon nitride film 11 is deposited on both sides of a second silicon wafer 1B and a desired pattern is likewise formed by lithographic techniques. It is then etched as shown in FIG. 5a in a manner similar to the process used for the first silicon wafer 1A. An anisotropic etching is then applied to the first silicon wafer 1A to form an air channel 9 (FIG. 5b). Likewise, anisotropic etching is also applied to the second silicon wafer 1B in a manner similar to the process used for the first silicon wafer 1A. In it, a wedge shaped pattern acting as a valve for fluid such as air is formed at the central portion of the second silicon wafer 1B (FIG. 5b).

Figure 5C:
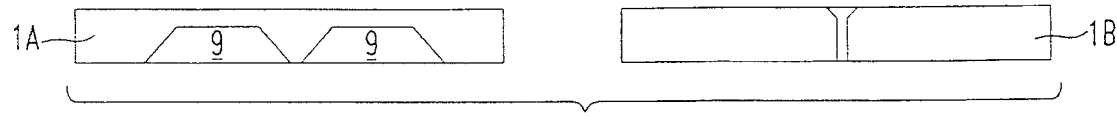
Figure 5D:
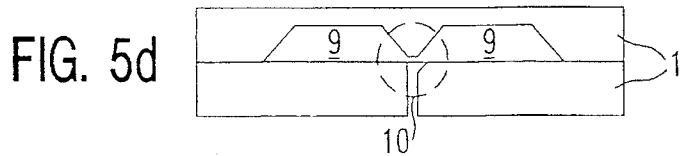

Referring to FIG. 5c, the silicon nitride film 11, which was deposited on the first and second silicon wafers 1A and 1B produced by the process shown in FIGS. 5a and 5b, is removed. Finally, the first and second silicon wafers 1A and 1B are thermally bonded to form a driving section (FIG. 5d). Circle 10 in FIG. 5d (enclosed by a broken line) is shown as the portion that functions as a valve for feeding air. Thus, a micro actuator with the structure shown in FIG. 3 is obtained. Finally, a contact pin 4 is formed on the driving section to complete the structure.

Following is a description of the operating principle of the present invention [FIGS. 6 and 7].

FIG. 6 shows a schematic diagram that illustrates the operating principle when Coulomb's force is used as the driving force. Similarly, FIG. 7 shows a schematic diagram that illustrates the operating principle when air pressure is used as the driving force.

Figure 6A:
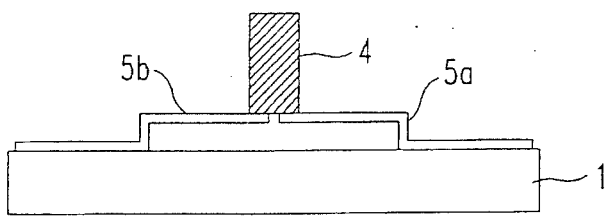
FIGS. 6a to 6e and 7a to 7d show the operating principle of the present invention.

First, the operating principle of the present invention will be described referring to FIG. 6. When no voltage is applied between the silicon wafer 1 and the silicon nitride films 5A and 5B, contact pin 4 remains static as its initial position (FIG. 6a). When a voltage is applied between silicon wafer 1 and silicon nitride film 5A, the silicon nitride film 5A is lowered by Coulomb's force in the direction shown by the arrow 12. As a result, a difference in height occurs between silicon nitride films 5A and 5B forcing the contact pin 4 placed between silicon nitride films 5A and 5B to tilt towards the right, while the end of the contact pin moves in the direction of the arrow 13 (FIG. 6b).

When a voltage is applied to silicon nitride films 5A and 5B, the films are lowered in the direction of the arrow 12 and 15 until they reach the same height. Thereafter, contact pin 4 returns to its upright position. (Note: it is important that silicon nitride films 5A and 5B are first lowered from their initial position). Thus, the end of contact pin 4 moves in the direction of the arrow 14 (FIG. 6c).

When the voltage applied to the silicon nitride film 5A is removed, the silicon nitride film 5A attempts to move back in the direction of the arrow 17, owing to a spring force inherent to its structure. As a result, the contact pin 4 moves to a position which is a mirror image of the position shown in FIG. 6b. Thus, the end of the contact pin moves in the direction of the arrow 16 (FIG. 6d). When the voltage applied to silicon nitride film 5B is removed, silicon nitride film 5B tries to move back in the direction of the arrow by a force inherent to its structure. Therefore, the end of the contact pin 4 moves in the direction of the arrow 13 (FIG. 6e).

Figure 6B:
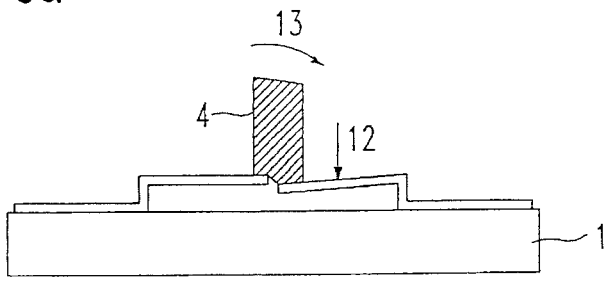
Figure 6C:
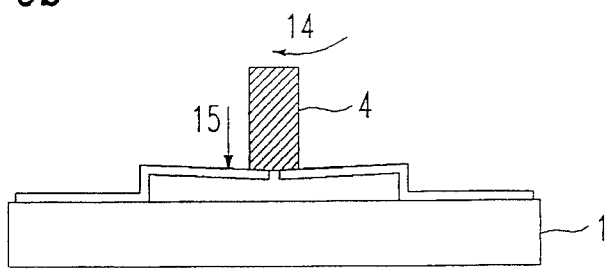
Figure 6D:
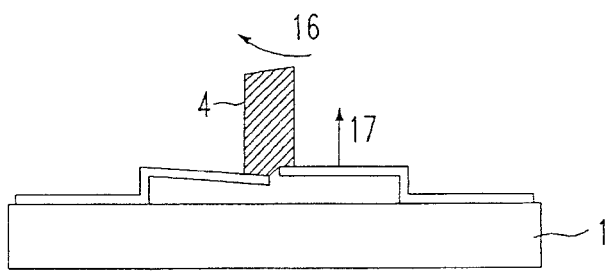
Figure 6E:
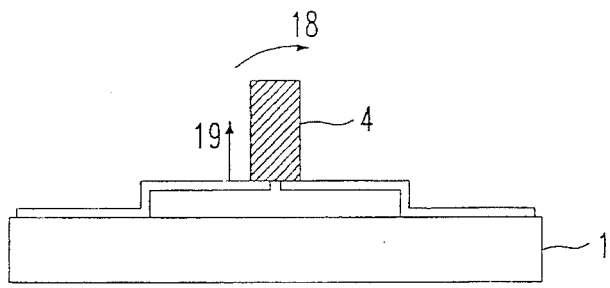

As previously described, the micro actuator is operated by the operating sequence shown in FIGS. 6b through 6d, forcing the end of contact pin 4 to rotate in a clockwise rotation.

The operating principle of the present invention is further explained by referring to FIG. 7. First, a voltage is applied to the silicon wafer 1B to close the wedge-typed air valve V. By applying Coulomb's force, the air-valve V adheres to the lower silicon wafer 1B. Air is supplied to the air channel 8 by an air pump (not shown) after closing the air valve V. Air, however, is not supplied to the right air channel $A_2$ but only to the left air channel $A_1$ (as a result of the air valve V being closed). Thus, the upper silicon wafer 1A is raised in the direction of the arrow 32 by air pressure in air channel $A_1$. A difference in height occurs between the silicon wafers 1A and 1B and the end of the contact pin 4 moves in the direction of the arrow 30 (FIG. 7a). When the voltage applied to the silicon wafer 1B is turned off, the air valve V opens, and air is supplied in the direction of the arrow 34 to both air channels $A_1$ and $A_2$. As a result, the silicon wafers 1A and 1B move in the direction of the arrow by air pressure in channels $A_1$ and $A_2$. Since a difference in height occurs between the silicon wafers 1A and 1B, the contact pin 4 returns to its upright position, although its height differs from its initial height. Thus, the end of the contact pin 4 moves in the direction of the arrow 36 (FIG. 7b).

Figure 7A:
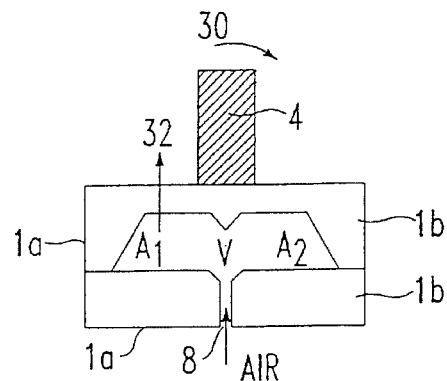
Figure 7B:
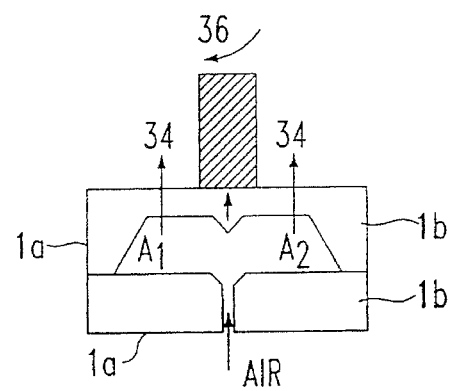
Figure 7C:
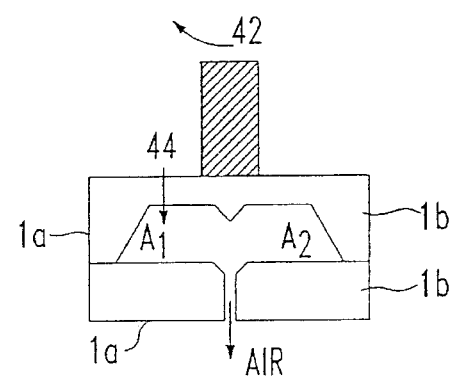
Figure 7D:
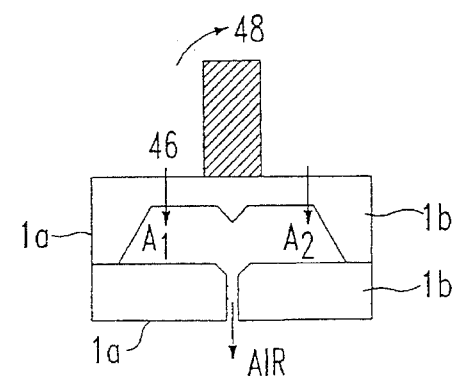

When a voltage is applied to the silicon wafer 1B, the wedge-type air valve V closes, air is released from the left air channel A1, and silicon wafer 1A is lowered in the direction of the arrow 44. As a result, because a difference in height occurs between the silicon wafers 1A and 1B, the contact pin 4 tilts and its end moves in the direction of the arrow 42 (FIG. 7c). Finally, when the air valve V, which had been closed in the step illustrated in FIG. 7c reopens, air supplied to the right air channel A2 is released. The silicon wafer 1B descends in the direction of the arrow until silicon wafers 1A and 1B reach the same height, at which time contact pin 4 returns to its initial position with the end of contact pin 4 moving in the direction of the arrow 46 (FIG. 7d).

As previously described, when air pressure is used as the driving force, the micro actuator follows a sequence similar to the one described in FIG. 6, and the end of the contact pin 4 rotates clockwise.

Though the operating principle of micro actuators using Coulomb's force and air pressure as driving forces are described above, the same holds true for a micro actuator that uses vibrational force as its driving force.

Figure 8:
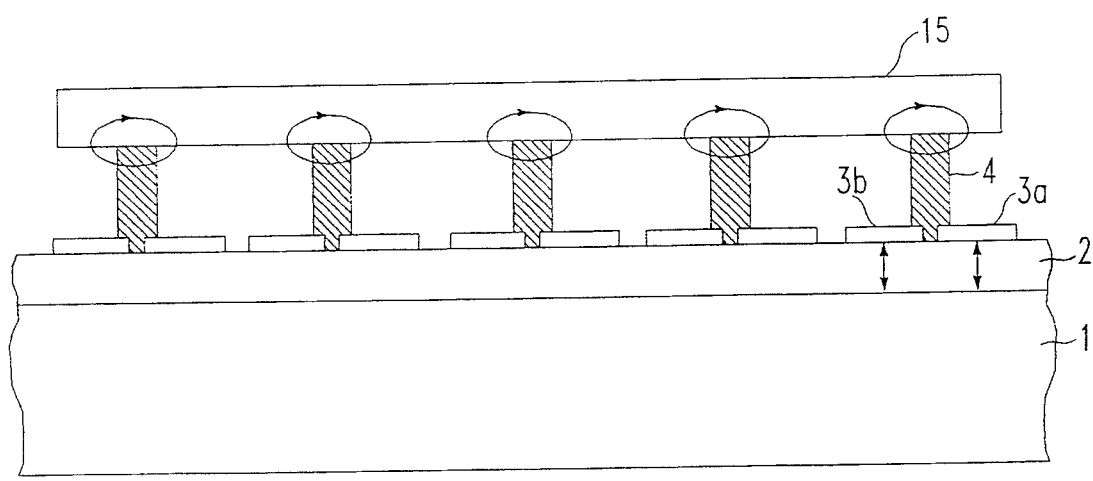
FIG. 8 shows a schematic structural diagram of the micro positioning device according to an embodiment of the present invention.

A micro positioning device can be structured by arranging the above micro actuators on the same surface as an array and arranging a moving member on the micro actuator array. FIG. 8 shows a schematic diagram of an X-axis-directional structure of a micro positioning device according to a further embodiment of the present invention. This embodiment uses vibrational force as its driving force.

In FIG. 8, a first voltage is applied to a first aluminum electrode 3A and a second voltage is applied to a second aluminum electrode 3B. The first and second voltages have a predetermined phase difference. Therefore, PZT 2 bonded on the silicon wafer 1 moves vertically or in the direction of the arrow with the predetermined phase difference. The vertical motion intermittently causes a difference in height between the first aluminum electrode 3A and the second aluminum electrode 3B. The end of contact pin rotates due to the intermittent height difference in the direction of the arrow. Therefore, the moving member 15 (e.g. a roller) placed on a plurality of contact pins 4, moves horizontally by motion of the contact pins 4. When the end of contact pin 4 moves leftward by driving an actuator, the actuator to the left side of the above actuator is activated, the end of the contact pin 4 moves rightward, and the roller 15 is pressed rightward by the actuator. Thus, the roller 15 is positioned at a certain balanced point.

In the above embodiment, only positioning in the X-axis direction was described. However, the same is also true for positioning in the Y-axis direction. Additionally, in the above embodiment, the driving forces use vibrational force. However, the positioning operation is the same as that of the above embodiment even if other types of driving forces are used, and even if the structure of the micro positioning device of the present invention differs.

As described above, the micro actuator of the present invention use a direct driving system directed by a plurality of actuators. It attains a high positioning accuracy even for open loop control. It also attains positioning within an operating range of several tens to several hundreds of micrometers in the X and Y directions. It is thus possible to obtain a compact and lightweight miniature micro positioning device.

While the invention has been particularly shown and described with reference to preferred embodiments thereof it will be understood by those skilled in the art that the foregoing and other changes in the form and details may be made therein without departing from the spirit and the scope of the invention.

What is claimed is:

1. A micro actuator using vibration force as its driving force, comprising:

a substrate;

a piezo electric element connected to a top surface of said substrate, said piezo electric element having at least two electrodes; and a contact pin connected across said at least two electrodes and extending upwards from a top surface of said piezo electric element.

2. A micro actuator using Coulomb's force as its driving force, comprising:

a substrate;

a cavity in a surface of said substrate;

at least two electrodes partially obstructing said cavity; and a contact pin connected across said at least two electrodes and extending upwards therefrom, whereby a voltage applied between one of said at least two electrodes and said substrate generates said Coulomb's force there between.

3. The micro actuator as recited in claim 2, wherein at least a portion of said electrodes is made of silicon nitrite.

4. The micro actuator as recited in claim 2, wherein said contact pin is made of resist.

5. A micro actuator using fluid as its driving force, comprising:

a substrate;

an orifice in said substrate;

deformable means on top of said substrate, at said orifice;

a wedged shaped valve extending from said deformable means towards said orifice; and a contact pin extending from said deformable means opposite said wedged shaped valve, wherein fluid injected through said orifice against said wedged shaped valve urges said deformable means away from said substrate, thereby forcing said contact pin in an upward motion.

6. The micro actuator as recited in claim 5, wherein said fluid is air.

7. The micro actuator as recited in claim 5, wherein said contact pin is made of resist.

8. A micro actuator using vibration force as its driving force, comprising:

a. a substrate;

b. a piezo electric element connected to said substrate;

c. at least two electrodes deposited on said piezo electric element; and d. a contact pin formed across said at least two electrodes.

9. The actuator as recited in claim 8, wherein said electrodes are aluminium electrodes.

10. The actuator as recited in claim 8, wherein said contact pin is made of resist.

11. The actuator of claim 10, wherein said resist is polyimide.

12. A micro actuator comprising:

a substrate;

driving means connected to said substrate for generating a substantially vertical motion; and conversion means coupled to said driving means for converting said substantially vertical motion into rotational motion.

13. The micro actuator as recited in claim 12, wherein said driving means further comprises:

a piezo element connected to a top surface of said substrate, said piezo electric element having at least two electrodes.

14. The micro actuator as recited in claim 13, wherein said electrodes are aluminum electrodes.

15. The micro actuator as recited in claim 13, wherein said conversion means further comprises: a contact pin connected across said at least two electrodes and extending upwards from a top surface of a piezo electric element.

16. The micro actuator as recited in claim 15, wherein said contact pin is made of resist.

17. The micro actuator of claim 16, wherein said resist is polyimide.

18. The micro actuator as recited in claim 12, wherein said substrate is provided with a cavity and said driving means further comprises two electrodes partially obstructing said cavity, and wherein by applying a voltage between one of said two electrodes and said substrate, a force is generated therebetween, thereby generating a substantially vertical motion.

* * * * *